(12) United States Patent
Ohno et al.

(10) Patent No.: US 6,549,392 B1
(45) Date of Patent: Apr. 15, 2003

(54) METHOD FOR REDUCING PARTICLES FROM AN ELECTROSTATIC CHUCK AND AN EQUIPMENT FOR MANUFACTURING A SEMICONDUCTOR

(75) Inventors: Masashi Ohno, Nagoya (JP); Mie Nagao, Chita (JP); Hiromichi Kobayashi, Yokkaichi (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/332,990

(22) Filed: Jun. 15, 1999

(30) Foreign Application Priority Data

Jun. 18, 1998 (JP) .............................. 10-187019

(51) Int. Cl.[7] .............................................. H01G 23/00
(52) U.S. Cl. ........................................ 361/234; 361/234
(58) Field of Search ........................................... 361/234

(56) References Cited

U.S. PATENT DOCUMENTS

| 5,312,780 A | 5/1994 | Nanda et al. .............. 437/225 |
| 5,380,682 A | 1/1995 | Edwards et al. ............ 437/225 |
| 5,671,116 A | 9/1997 | Husain ........................ 361/234 |
| 5,709,757 A | 1/1998 | Hatano et al. ............ 134/22.14 |
| 6,177,661 B1 * | 1/2001 | Lee et al. .................... 219/635 |
| 6,207,932 B1 * | 3/2001 | Yoo ........................ 219/444.1 |

FOREIGN PATENT DOCUMENTS

| JP | 04087321 A1 | 3/1992 | |
| JP | 4-297054 | 10/1992 | .......... H01L/21/66 |
| JP | 04298062 | 10/1992 | |
| JP | 05029232 | 2/1993 | |
| JP | 07 245 336 A | 9/1995 | |
| JP | 08 055 900 A | 2/1996 | |
| JP | 8-191059 | 7/1996 | ........ H01L/21/3065 |

* cited by examiner

Primary Examiner—Stephen W. Jackson
(74) Attorney, Agent, or Firm—Parkhurst & Wendel, LLP

(57) ABSTRACT

A method for reducing particles from an electrostatic chuck, wherein the difference between a wafer temperature before absorbing and a wafer maximum temperature after absorbing is 50° C. or below when the wafer is absorbed onto the electrostatic chuck.

4 Claims, 2 Drawing Sheets

US 6,549,392 B1

METHOD FOR REDUCING PARTICLES FROM AN ELECTROSTATIC CHUCK AND AN EQUIPMENT FOR MANUFACTURING A SEMICONDUCTOR

BACKGROUND OF THE INVENTION (1) Field of the invention

This invention relates to a method for reducing particles from an electrostatic chuck and an equipment for manufacturing a semiconductor, more particularly to a method for reducing particles from an electrostatic chuck and an equipment for manufacturing a semiconductor applying the method, which are usable for film-forming on a semiconductor wafer.

(2) Related Art Statement:

In each step of conveying a semiconductor wafer, exposure, film-forming by CVD, sputtering, etc., microprocessing, cleaning, etching, dicing, or the like, an electrostatic chuck is employed for absorbing and holding the semiconductor wafer.

Particularly, from the views of using, as an etching gas or a cleaning gas, a halogen-based corrosive gas such as $ClF_3$, an equipment for manufacturing a semiconductor requires a high heat conduction for rapidly heating and cooling a semiconductor wafer with holding it and requires a high shock resistance so as not to be destroyed due to such a remarkable temperature change. Thus, a material made of dense aluminum nitride, dense alumina, or the like is promised.

On the other hand, inside the semiconductor-manufacturing equipment, the occurrence of particles, which results in defects of the semiconductor, is needed to be prevented. The particles are mainly generated from a backside surface of the semiconductor, a part of which attaches on the semiconductor wafer directly, the other part of which spreads in and attaches on a wall of a chamber. Then, the particles are peeled off of the wall, and thereby results in defects of a semiconductor.

In view of the above problems, JP A 7-245336 discloses a method in which uneven portions in an absorbing face of an electrostatic chuck made of ceramic material are ground by irradiating a plasma and the fine protuberances of the uneven portions are removed, and thereby the occurrence of particles is reduced. The method is based on the finding of the cause of particles' occurrence that a silicon wafer having relatively low hardness is ground by the uneven portions when the silicon wafer contacts the uneven portions.

Moreover, JP A 8-55900 discloses a method in which a contacting shock of a silicon wafer with an electrostatic chuck is reduced by slowly rising a voltage to the electrostatic chuck when the silicon wafer is absorbed to the electrostatic chuck, and thereby the particles' occurrence due to the uneven portions of the absorbing face in the electrostatic chuck is decreased.

The particles' occurrence cannot be, however, sufficiently reduced by the above methods. That is, the semiconductor-manufacturing process requires that the number of particles within an 8-inch wafer, for example, is decreased to several hundreds, but the number can be decreased to only several thousand by the above methods.

Thus, even though the occurrence of the particles is reduced by the above methods, it is difficult to manufacture semiconductors with a sufficiently high yield.

SUMMARY OF THE INVENTION

It is an object of the present invention to provide a method for reducing particles from an electrostatic chuck, whereby occurrence of the particles is reduced in semiconductor-manufacturing processes and semiconductors can be manufactured with a sufficiently high yield, and an equipment for manufacturing semiconductors utilizing the method.

This invention relates to a method for reducing particles from an electrostatic chuck, wherein the difference between a wafer temperature before absorbing and a wafer maximum temperature after absorbing is 50° C. or below when the wafer is absorbed onto the electrostatic chuck.

Particularly, from the views of using, as an etching gas or a cleaning gas, a halogen-based corrosive gas such as $ClF_3$, an equipment for manufacturing a semiconductor requires a high heat conduction for rapidly heating and cooling a semiconductor wafer with holding it and requires a high shock resistance so as not to be destroyed due to such a remarkable temperature change. Thus, a material made of dense aluminum nitride, dense alumina, or the like is promised.

This invention still more relates to a semiconductor-manufacturing equipment, comprising a preheating means for preheating a wafer to a given temperature, a wafer's preheating temperature-measuring means for measuring a preheating temperature of the preheated wafer, a preheating chamber having the preheating means and the wafer's preheating temperature-measuring means, an electrostatic chuck for absorbing the wafer, a heating means for heat the wafer to a given film-forming temperature, a wafer's heating temperature-measuring means for measuring a heating temperature of the wafer, and a film-forming chamber having the electrostatic chuck, the wafer's heating temperature-measuring means and the heating means, said semiconductor-manufacturing equipment further comprising a controlling system which monitors and calculates electric signals from the wafer's preheating temperature measured by the wafer's preheating temperature-measuring means and the wafer's heating temperature measured by the wafer's heating temperature-measuring means, and, based on the calculated results, transmits controlling signals for controlling the preheating means and the heating means.

The reason for reduction of the particles' occurrence, according to the present invention, is not clear, but can be considered as follows.

That is, it is considered that the difference between wafer's heat expansions before and after absorbing can be reduced by making 50° C. or below the difference between the wafer's temperature before absorbing and the wafer's maximum temperature after absorbing, and thereby the wafer is not often rubbed to an electrostatic chuck, so that an amount of the wafer to be ground is decreased.

Hereupon, the wording "wafer's temperature before absorbing" means a temperature within 0 sec to 60 sec just before absorbing the wafer onto the electrostatic chuck.

On the other hand, the wording "wafer's maximum temperature after absorbing" means a maximum temperature at which the wafer arrives in absorbing and releasing it onto and from the electrostatic chuck.

BRIEF DESCRIPTION OF THE DRAWINGS

For a better understanding of this invention, reference is made to the attached drawings, wherein.

DESCRIPTION OF THE PREFERRED EMBODIMENTS

In the following, the present invention will be explained in more detail along with embodiments of the invention.

The method of the present invention requires that the difference between a wafer's temperature before absorbing and a wafer's maximum temperature after absorbing is 50° C. or below, preferably 46° C. or below. If the temperature difference is more than 50° C., the object of the present invention can not attained.

In semiconductor-manufacturing steps such as exposing, micro-processing, cleaning, etching, dicing, etc., heating the wafer is not particularly required, so that a special means is not needed to realize the above mentioned temperature difference.

On the other hand, in a film-forming step such as CVD or sputtering, for epitaxially growing a semiconductor film onto a wafer as a substrate, heating the substrate more than 100° C. is generally required. It is carried out by heating the absorbing face of the electrostatic chuck to the above temperature with a heater, for example, built-in the electrostatic chuck to absorb the substrate or arranged under the electrostatic chuck so as to contact the chuck.

Thus, in absorbing the wafer onto the absorbing face of the electrostatic chuck, for making 50° C. or below the difference between the wafer's temperature before absorbing and the wafer's maximum temperature after absorbing, preheating the wafer before absorbing is required.

The preheating may be carried out by a conventional method that a preheating chamber is installed before a film-forming process-chamber for carrying out a film-forming process and, after the wafer is heated to a given temperature with a preheating means provided in the preheating chamber, the wafer is conveyed to the film-forming process chamber with a wafer-conveying means.

In the above method, however, the wafer's temperature is decreased due to a heat emission from the heated wafer during conveying, so that, in the preheating chamber, the wafer is required to be heated to a higher temperature than a desired temperature and thereby an excess energy and an time are inefficiently needed for the heating. Therefore, as is explained as follows, it is preferable that a heating means is provided on the wafer-conveying means and the preheating is carried out with the heating means.

Figure 1:
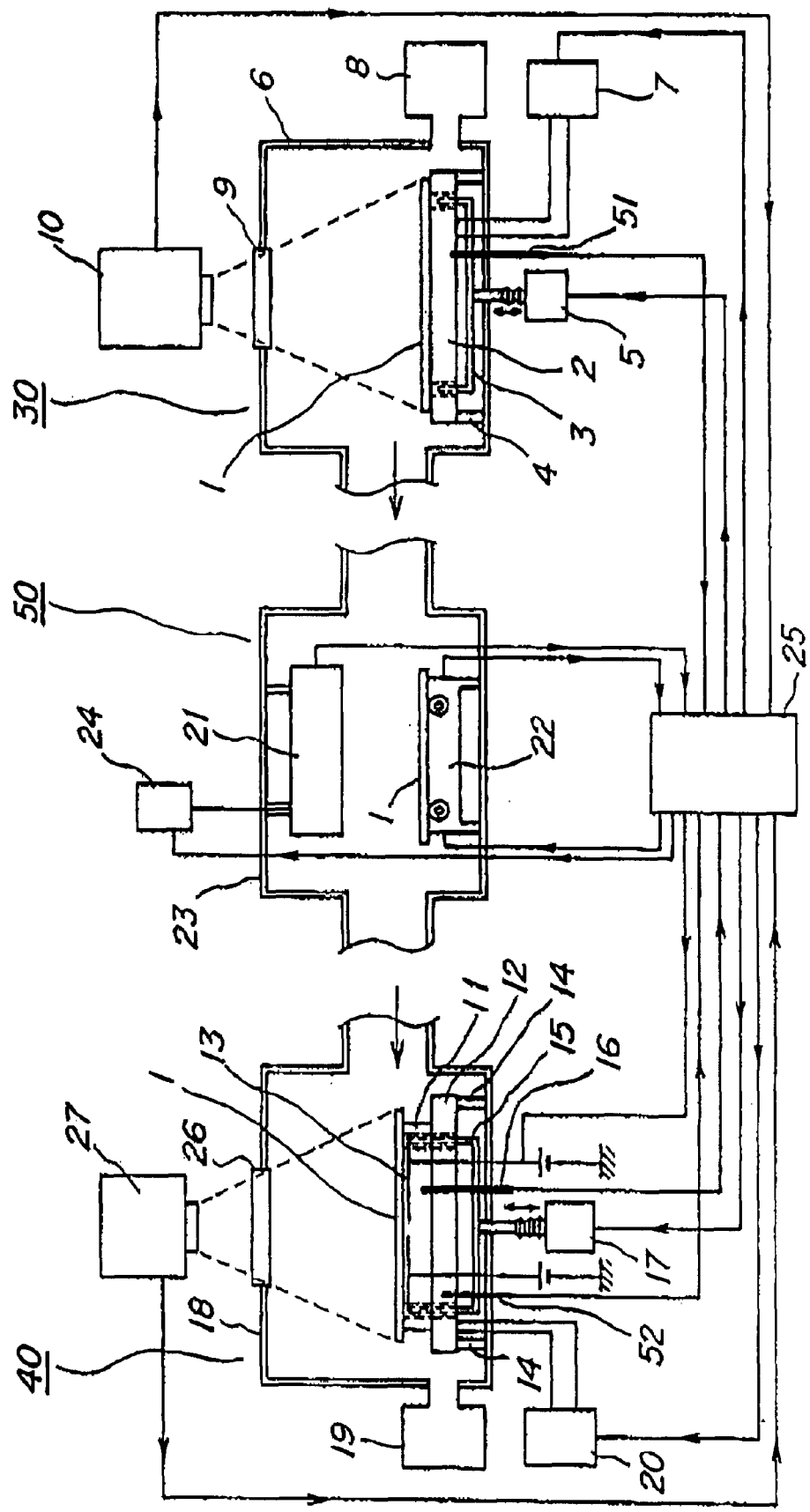
FIG. 1 is a schematic view showing an embodiment of a semiconductor-manufacturing equipment preferably usable for the method according to the present invention.

FIG. 1 is a schematic view showing an embodiment of a semiconductor-manufacturing equipment preferably usable for the method according to the present invention.

In FIG. 1, for simplifying, there are only shown a preheating chamber 30, a film-forming process-chamber 40, and a wafer-conveying means 50. Hereupon, in FIG. 1, the preheating chamber 30 is installed before the wafer-conveying means 50, but the preheating chamber 30 may be arranged just before the film-forming process-chamber 40 and the wafer-conveying means 50 may be installed before the preheating chamber 30, whereby the heating the wafer may be effectively carried out.

An infrared lamp 21 is employed as a convey-heating means in the wafer-conveying means 50, but a heater embedded in the convey-fork instead of a wafer loader 22 may be used.

In the preheating chamber 30, a heater 2 is provided on a supporting pedestal 4 as the preheating means to preheat a wafer 1. An infrared radiation thermometer 10 is provided as a preheating temperature-measuring means to measure the preheated temperature of the wafer above a chamber 6 through a sapphire glass window 9. Moreover, a lift pin 3 and a lift pin-elevating equipment 5 to absorb and release the wafer for the heater 2 are provided.

In the film-forming chamber 40, an electrostatic chuck 11 to absorb the wafer 1 is provided on a supporting pedestal 14 through a heater 12 as a means for heating the wafer. A thermocouple 16 to measure the temperature of the electrostatic chuck 11 is provided and an infrared radiation thermometer 27 is provided as a wafer's heated temperature-measuring means to measure the heating temperature of the wafer. Furthermore, a lift pin 15 and a lift pin-elevating equipment 17 to absorb and release the wafer 1 onto and from the electrostatic chuck 11.

The wafer-conveying means 50 has the wafer loader 22 to convey the wafer 1 and an infrared lamp 21, on an upper surface of a chamber 23, as a convey-heating means to heat the wafer 1.

The temperature of the wafer 1 is monitored with the infrared radiation thermometers 10 and 27 and transmitted as an electric signal to a controlling system 25, and thereafter calculated with a computer inside the controlling system 25.

A reference temperature curve of the wafer is input into the controlling system 25, calculated from conveying speeds of the wafer loader 22 and output powers of the infrared lamp 21. Then, the actual conveying speed of the wafer loader 22 and the actual output from the infrared lamp 21 are transmitted as electric signals to the controlling system 25 and controlling signals are transmitted to the wafer loader 22 and a lamp's power supply 24 by the electric signals thereof being compared with the temperature curve, and thereby the wafer is maintained at a given temperature.

In the case of using an equipment shown in FIG. 1, the steps of the method according to the present invention are described hereinafter.

First, the wafer 1 is conveyed to the preheating chamber 30 and put onto the lift pin 3 in its above position and thereafter, by moving downwardly the lift pin 3 with the lift pin-elevating equipment 5, set onto the heater 2 while the preheating chamber 30 is evacuated to a pressure under $10^{-5}$ Torr with a vacuum-pump 8.

Next, by heating the heater 2 with a heater power supply 7, the wafer 1 on the heater 2 is heated up to a temperature of not less than 100° C. The temperature of the heater 2 is monitored with the thermocouple 51 for controlling a heater, and the temperature of the wafer 1 is monitored with the infrared radiation thermometer 10. A monitored signal from the heater-controlling thermocouple 51 is transmitted as an electric signal to the controlling system 25 in which the electric signal is calculated with a computer.

When the wafer 1 arrived at a given temperature, by moving upwardly the lift pin 3 with the lift pin-elevating equipment 5, the wafer 1 is released from the heater 2.

Then, the wafer 1 is moved to the film-forming chamber 40 with the wafer-conveying means 50. At this point, as above-mentioned, for developing a heating efficiency without temperature degradation of the preheated wafer in the step of conveying the wafer 1 with the wafer loader 22, the wafer 1 is heated with the infrared lamp 21 in the wafer-conveying means 50. The heating the wafer 1 is carried out by the above method, and the temperature of the wafer 1 is maintained at a temperature of not less than 100° C. Hereupon, the interior of the chamber 23 in the wafer-conveying means 50 is maintained at a pressure of not more than $10^{-8}$ Torr with the vacuum-pumps 8 and 19 in the preheating chamber 30 and the film-forming process-chamber 40 provided in line before and after the wafer-conveying means 50.

The wafer 1 is moved to the film-forming process-chamber 40 with the wafer-conveying means 50, and thereafter, put onto the elevated the lift pin 15 as well as in the preheating chamber 30. Next, the wafer 1 is set onto the electrostatic chuck 11 by going downwardly the lift pin 15 with the lift pin-elevating equipment 17, and after the temperature of the wafer 1 is measured with the infrared emission thermometer 27 just before absorbing, the wafer 1 is absorbed to the electrostatic chuck 11 by applying a given voltage to the electrostatic chuck-electrode 13.

Next, a semiconductor film is formed on the wafer 1 by carrying out a film-forming treatment such as CVD or sputtering.

The temperature of the heater 12 is monitored with a thermocouple 52 for controlling the heater and the temperature of the electrostatic chuck 11 is monitored with the thermocouple 16. Then, these signals are transmitted as electric signals to the controlling system 25. The electric signals are calculated with a computer in the controlling system 25 and thereafter, a controlling signal from the controlling system 25 is transmitted to a heater-power supply 20, whereby the heater 12 is controlled in heating operation.

After finishing film-forming formation, the voltage to the electrostatic chuck-electrode 13 of the electrostatic chuck 11 is turned off and the wafer 1 is released from the electrostatic chuck 11 by moving upwardly the lift pin 15 with the lift pin-elevating equipment 17. Thereafter, the thus formed semiconductor film is treated by such a micro-processing.

EXAMPLES AND COMPARATIVE EXAMPLES

This invention is described in detail hereinafter with reference to the following examples.

Example 1

By using such an equipment as shown in FIG. 1 and following the steps as above-mentioned, a silicon wafer 1 having a diameter of 8 inches was heated to a temperature of 320° C. under a pressure of $10^{-5}$ Torr in the preheating chamber 30, and thereafter, conveyed to the film-forming chamber 40 with the wafer-conveying means 50.

The pressure inside the chamber 23 of the wafer-conveying means 50 was $10^{-5}$ Torr, and the temperature of the wafer 1 during conveying was held at 310° C. with the infrared lamp 21. Hereupon, the conveying speed of the wafer loader 22 was 0.1 m/sec and the input electric power from the lamp power supply 24 to the infrared lamp 21 was 1 kW.

Next, the wafer 1, which was conveyed to the film-forming chamber in a pressure of $10^{-8}$ Torr, was put and absorbed onto the electrostatic chuck 11 heated to a temperature of 300° C., following the steps as above-mentioned.

When the temperature of the wafer 1 just before absorbing was measured, the temperature was 298° C. When the maximum temperature of the wafer 1 after absorbing was measured, the temperature was 300° C. The difference between their temperatures was 2° C.

After absorbing for 10 minutes, following the steps as the above-mentioned, the wafer 1 was released from the electrostatic chuck 11. Then, when dusts having a dimension of not less than 0.2 μm on the wafer 1 was investigated with a dust-inspecting equipment (WM-1500 made by Topcon Inc.), about 1180 dusts existed thereon.

Example 2

Except that the preheating temperature was 300° C. in the preheating chamber 30 and that the input electric power from the lamp-power supply 24 was 1 kW, based on the signal from the wafer loader 22 in the wafer-conveying method 50, whereby the wafer temperature during conveying was 291° C., the preheating the wafer 1 was carried out as well as in Example 1 using a silicon wafer having a diameter of 8 inches in the same manner as in Example 1.

Next, the wafer 1 was put and absorbed onto the electrostatic chuck 11 kept at a temperature of 300° C. in the same manner as in Example 1. The temperature of the wafer 1 just before absorbing was 282° C. and the maximum temperature thereof after absorbing was 300° C., and therefore the difference between their temperatures was 18° C.

When the wafer 1 was released from the electrostatic chuck 11 and dusts having a dimension of not less than 0.2 μm were investigated, about 1220 dusts were observed.

Example 3

Except that the preheating temperature was 270° C. in the preheating chamber 30 and that the input electric power from the lamp-power supply 24 was 1 kW, based on the signal from the wafer loader 22 in the wafer-conveying means 50, whereby the wafer temperature during conveying was 261° C., the preheating the wafer 1 was carried out in the same manner as in Example 1 using a silicon wafer having a diameter of 8 inches as well as in Example 1.

Next, the wafer 1 was put and absorbed onto the electrostatic chuck 11 kept at a temperature of 300° C. in the same manner as in Example 1. The temperature of the wafer 1 just before absorbing was 252° C. and the maximum temperature thereof after absorbing was 298° C., and therefore the difference between their temperatures was 46° C.

When the wafer 1 was released from the electrostatic chuck 11 and dusts having a dimension of not less than 0.2 μm were investigated, about 1120 dusts were observed.

Comparative Example 1

Except that the preheating temperature was 260° C. in the preheating chamber 30 and that the input electric power from the lamp-power supply 24 was 1 kW, based on the signal from the wafer loader 22 in the wafer-conveying means 50, whereby the wafer temperature during conveying was 233° C., the preheating the wafer 1 was carried out in the same manner as in Example 1 using a silicon wafer having a diameter of 8 inches as in the above Examples.

Next, the wafer 1 was put and absorbed onto the electrostatic chuck 11 kept at a temperature of 300° C. in the same manner as in Example 1. The temperature of the wafer 1 just before absorbing was 245° C. and the maximum temperature thereof after absorbing was 297° C., and therefore the difference between their temperatures was 52° C.

When the wafer 1 was released from the electrostatic chuck 11 and dusts having a dimension of not less than 0.2 μm were investigated, about 2330 dusts were observed.

Comparative Example 2

Except that the preheating temperature was 240° C. in the preheating chamber 30 and that the input electric power from the lamp-power supply 24 was 1 kW, based on the signal from the wafer loader 22 in the wafer-conveying method 50, whereby the wafer temperature during conveying was 233° C., the preheating the wafer 1 was carried out in the same manner as in Example 1 using a silicon wafer having a diameter of 8 inches as in the above Examples.

Next, the wafer 1 was put and absorbed onto the electrostatic chuck 11 kept at a temperature of 300° C. in the same manner as in Example 1. The temperature of the wafer 1 just before absorbing was 226° C. and the maximum temperature thereof after absorbing was 296° C., and therefore the difference between their temperatures was 70° C.

When the wafer 1 was released from the electrostatic chuck 11 and dusts having a dimension of not less than 0.2 µm were investigated, about 3300 dusts were observed.

As is apparent from the above Examples and Comparative Examples, making 50° C. or below the difference between the temperature of the wafer just before absorbing it onto the electrostatic chuck and the maximum temperature thereof after doing so, according to the present invention, the dusts, that is, particles on the wafer 1 can be remarkably reduced.

Figure 2:
FIG. 2 is a microscopic photograph of a absorbing face of an electrostatic chuck in the case of absorbing and releasing a wafer according to the method of the present invention.
Figure 3:
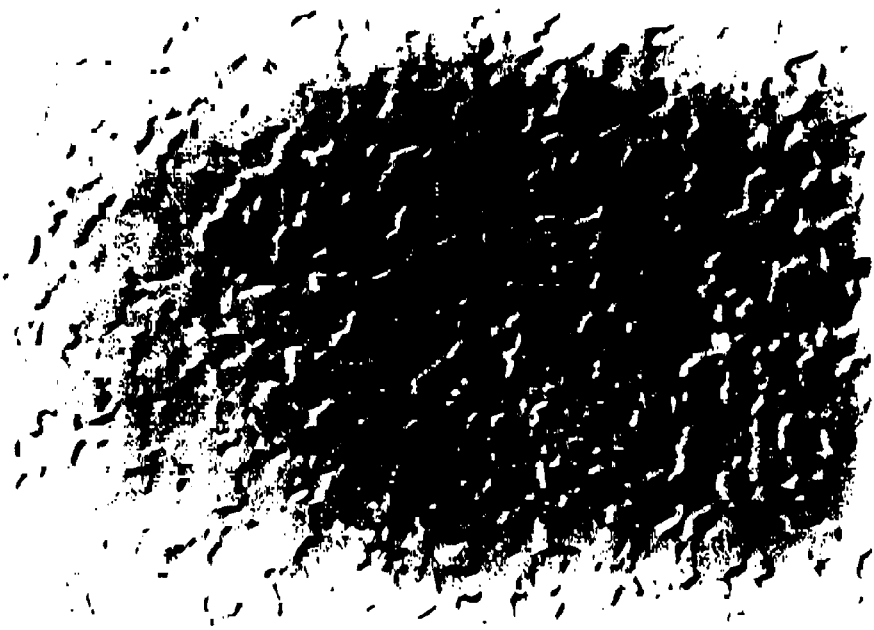
FIG. 3 is a microscopic photograph of a absorbing face of an electrostatic chuck in the case of absorbing and releasing a wafer according to a different method from that of the present invention.

Moreover, in FIG. 2, there is shown the microscopic photograph of the absorbing face in the electrostatic chuck in Example 3, and in FIG. 3, there is shown the microscopic photograph of the absorbing face in the electrostatic chuck in Comparative Example 1. White spot-like portions correspond to the particles.

From the microscopic photographs in FIGS. 2 and 3, too, making 50° C. or below the difference between the temperature of the wafer just before absorbing it onto the electrostatic chuck and the maximum temperature thereof after doing so, according to the present invention, the particles on the wafer 1 can be remarkably reduced.

As above-mentioned, making 50° C. or below the difference between the temperature of the wafer just before absorbing and the maximum temperature thereof after absorbing, according to the present invention, the particles on the wafer can be remarkably reduced, so that defects of a semiconductor can be decreased.

What is claimed is:

1. A method for minimizing the presence of particles on an electrostatic chuck, wherein a wafer to be held on such chuck is pre-heated so that the difference between wafer temperature before holding and wafer maximum temperature after holding is 50° C. or below when such a wafer is held by an electrostatic chuck.

2. A particle-reducing method as defined in claim 1, wherein the difference between wafer temperature before holding and wafer maximum temperature after holding is 46° C. or below.

3. A particle-reducing method as defined in claim 1, wherein the wafer is preheated with a convey-heating means installed in a wafer-conveying means for conveying the wafer to a holding face of the electrostatic chuck before holding the wafer on the holding face of the chuck.

4. A particle-reducing method as defined in claim 1, wherein before holding the wafer on a holding face of the electrostatic chuck, the wafer is preheated to a given temperature in a preheating chamber for preheating the wafer and preheated with a convey-heating means installed in a wafer-conveying means for conveying the wafer to the holding face of the electrostatic chuck.

* * * * *